United States Patent
Maehata

(10) Patent No.: US 10,090,855 B2
(45) Date of Patent: Oct. 2, 2018

(54) DELTA-SIGMA MODULATOR, AND TRANSMITTER

(71) Applicant: SUMITOMO ELECTRIC INDUSTRIES, LTD., Osaka-shi, Osaka (JP)

(72) Inventor: Takashi Maehata, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/527,034

(22) PCT Filed: Nov. 17, 2015

(86) PCT No.: PCT/JP2015/082225
§ 371 (c)(1),
(2) Date: May 16, 2017

(87) PCT Pub. No.: WO2016/103981
PCT Pub. Date: Jun. 30, 2016

(65) Prior Publication Data
US 2017/0331490 A1    Nov. 16, 2017

(30) Foreign Application Priority Data

Dec. 22, 2014 (JP) ................................ 2014-259414
Jun. 18, 2015 (JP) ................................ 2015-122752

(51) Int. Cl.
*H03M 3/00* (2006.01)
*H03K 7/08* (2006.01)

(52) U.S. Cl.
CPC .............. *H03M 3/378* (2013.01); *H03K 7/08* (2013.01); *H03M 3/438* (2013.01); *H03M 3/496* (2013.01)

(58) Field of Classification Search
CPC ...... H03M 3/378; H03M 3/496; H03M 3/438; H03M 3/352; H03K 7/08
(Continued)

(56) References Cited

U.S. PATENT DOCUMENTS 7,245,246 B2 * 7/2007 Ihs .................... H03M 3/352
                                                    341/118
7,894,536 B2 * 2/2011 Risbo .................. H03M 3/388
                                                    341/120
(Continued)

FOREIGN PATENT DOCUMENTS

JP    2014-014059 A    1/2014
JP    2014-042209 A    3/2014
(Continued)

OTHER PUBLICATIONS

International Search Report issued in PCT/R2015/082225 dated Dec. 28 with English Translation.
(Continued)

*Primary Examiner* — Khai M Nguyen
(74) *Attorney, Agent, or Firm* — Drinker Biddle & Reath LLP

(57) ABSTRACT

A delta-sigma modulator is provided with: a loop filter 30; a quantizer 36 that generates quantized data on the basis of an output from the loop filter 30; an internal path 42 connected to the loop filter 30 or the quantizer 36; and a compensator 38 that provides, to the internal path 42, a compensation signal for compensating for distortion that occurs in a frequency component at a target frequency, the frequency component being among frequency components of a pulse train corresponding to the quantized data.

11 Claims, 14 Drawing Sheets

(58) Field of Classification Search
USPC .................................. 341/118, 143; 375/295
See application file for complete search history.

(56) References Cited

U.S. PATENT DOCUMENTS

| | | | | |
|---|---|---|---|---|
| 7,973,689 B2 * | 7/2011 | Glass | ................... | H03M 3/348 |
| | | | | 341/118 |
| 2004/0046680 A1 | 3/2004 | Masuda et al. | | |

FOREIGN PATENT DOCUMENTS

| | | |
|---|---|---|
| JP | 2014-165846 A | 9/2014 |
| WO | WO-03/030373 A1 | 4/2003 |

OTHER PUBLICATIONS

Takashi Maehata, et al., "Suppression Technology of the Non-linear Component in 1-bit Bandpass ΔΣ Modulation," 2015 Nen The Institute of Electronics, Information and Communication Engineers Sogo Taikai Koen Ronbunshu, Feb. 24, 2015 (Feb. 24, 2015), Tsushin 1, p. 559.

\* cited by examiner

Eye pattern

Sout(t)

Sideal(t)

fsymm(t)

fasym(t)

Eye pattern

DELTA-SIGMA MODULATOR, AND TRANSMITTER

TECHNICAL FIELD

The present invention relates to delta-sigma modulators, and transmitters.

BACKGROUND ART

Patent Literature 1 discloses a delta-sigma modulator. The delta-sigma modulator includes, as basic components, a loop filter, a quantizer, and an internal path connecting the loop filter and the quantizer. The delta-sigma modulator subjects an input signal to delta-sigma modulation, and generates quantized data.

CITATION LIST

Patent Literature

PATENT LITERATURE 1: Japanese Laid-Open Patent Publication No. 2014-14059

SUMMARY OF INVENTION

Technical Problem

The quantized data generated by the delta-sigma modulator includes an analog signal component, such as an RF signal, at a predetermined frequency (target frequency). However, there are cases where the analog signal component has distortion caused by delta-sigma modulation.

For example, Patent Literature 1 discloses that the pulse waveform of a pulse train outputted from the delta-sigma modulator affects signal characteristics of an analog signal represented by the pulse train outputted from the delta-sigma modulator. The pulse waveform of the pulse train outputted from the delta-sigma modulator causes distortion in the analog signal represented by the pulse train.

Patent Literature 1 discloses that the pulse train outputted from the delta-sigma modulator is subjected to processing for compensating for degradation of the signal characteristics of the analog signal.

In Patent Literature 1, distortion caused by delta-sigma modulation is compensated for by the processing performed after the delta-sigma modulation. However, it is advantageous if compensation for distortion that occurs in the frequency component at the target frequency can be performed not only by the processing performed after the delta-sigma modulation but also by the delta-sigma modulator itself.

Solution to Problem

The present invention according to one aspect is a delta-sigma modulator including: a loop filter; a quantizer configured to generate quantized data on the basis of an output from the loop filter; an internal path connected to the loop filter or the quantizer; and a compensator configured to provide, to the internal path, a compensation signal for compensating for distortion that occurs in a frequency component at a target frequency, the frequency component being among frequency components of a pulse train corresponding to the quantized data.

Advantageous Effects of Invention

According to the present invention, the delta-sigma modulator itself can compensate for the distortion that occurs in the frequency component at the target frequency.

DESCRIPTION OF EMBODIMENTS

Figure 1:
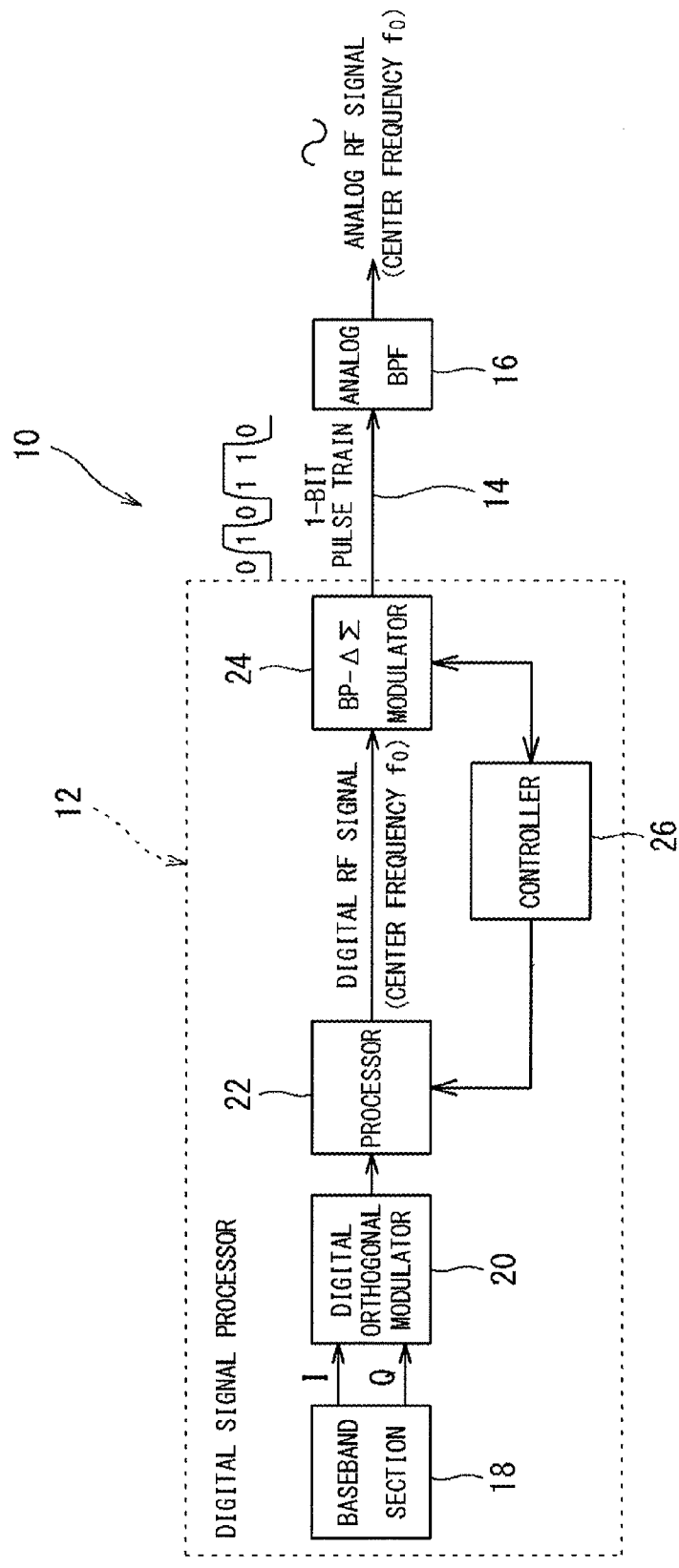
FIG. 1 is a block diagram showing a transmitter (communication system).

Hereinafter, an embodiment will be described with reference to the drawings.

1. Outline of Embodiment (1) A delta-sigma modulator according to an embodiment includes: a loop filter; a quantizer configured to generate quantized data on the basis of an output from the loop filter; an internal path connected to the loop filter or the quantizer; and a compensator configured to provide, to the internal path, a compensation signal for compensating for distortion that occurs in a frequency component at a target frequency, the frequency component being among frequency components of a pulse train corresponding to the quantized data. Since the delta-sigma modulator is provided with the compensator, the delta-sigma modulator itself can compensate for the distortion that occurs in the frequency component at the target frequency.

(2) Preferably, the distortion includes distortion that occurs in the frequency component at the target frequency due to asymmetry in rising and falling of a pulse in the pulse train corresponding to the quantized data. In this case, even when rising and falling of a pulse in the pulse train are asymmetric, distortion that occurs in the frequency component at the target frequency due to the asymmetry is compensated for in the quantized data outputted from the delta-sigma modulator.

(3) Preferably, the compensator includes: a detector configured to detect a change in the quantized data; and a generator configured to generate the compensation signal on the basis of the change in the quantized data which is detected by the detector. By detecting a change in the quantized data, the detector can detect occurrence of asymmetry in rising and falling of a pulse in the pulse train. Therefore, by generating the compensation signal on the basis of a change in the quantized data, the generator can generate the compensation signal on the basis of occurrence of asymmetry.

(4) Preferably, the detector outputs a detection signal at a timing when the quantized data changes. In this case, the generator can generate the compensation signal on the basis of the detection signal outputted at the timing when the quantized data changes.

(5) Preferably, the generator includes a fractional delay, and the fractional delay generates the compensation signal on the basis of the detection signal. The fractional delay facilitates generation of the compensation signal for compensating for distortion that occurs in the frequency component at the target frequency due to the asymmetry.

(6) Preferably, the quantizer is a 1-bit quantizer. In the case of the 1-bit quantized data, asymmetry in rising and falling of a pulse train is likely to be a problem, and therefore, it is advantageous that the delta-sigma modulator itself performs compensation.

(7) Preferably, the internal path includes a first path for feeding the quantized data back to the loop filter, and the compensator provides the compensation signal to the first path. By providing the compensation signal to the first path for feeding the quantized data back to the loop filter, the operation is easily stabilized.

(8) The internal path may include a second path for providing an output from the loop filter to the quantizer, and the compensator may provide the compensation signal to the second path. This structure enables compensation by the compensation signal.

(9) Preferably, the internal path includes a second path for providing an output from the loop filter to the quantizer, and the compensator provides the compensation signal to the first path and the second path. This structure enables distortion compensation over a wide band.

(10) A transmitter according to an embodiment outputs, as a transmission signal, a pulse corresponding to the quantized data.

2. Details of Embodiment

[2.1 Structure of Transmitter]

FIG. 1 shows a transmitter 10. This transmitter 10 includes a digital signal processor 12, and an analog filter 16. The digital signal processor 12 outputs a digital signal (1-bit pulse train) representing an RF (Radio Frequency) signal which is an analog signal. The RF signal is a signal to be radiated as a radio wave into space, and is, for example, an RF signal for mobile communication or an RF signal for broadcast services.

The pulse train outputted from the digital signal processor 12 is provided to the analog filter (a bandpass filter or a low-pass filter) 16. The analog signal represented by the pulse train outputted from the digital signal processor 12 includes, as noise components, components at frequencies other than the frequency (target frequency) of the RF signal. The noise components are removed by the analog filter.

A signal transmission path 14 between the digital signal processor 12 and the analog filter 16 may be signal wiring formed on a circuit board, or may be a communication cable such as an optical fiber cable, an electric cable, or the like.

The digital signal processor 12 includes: a baseband section 18 that outputs a baseband signal (IQ signal) which is a transmission signal; a modulator (orthogonal modulator) 20 that modulates the baseband signal; a processor 22; a delta-sigma modulator 24; and a controller 26.

The baseband section 18 outputs, as digital data, an IQ baseband signal (an I signal, a Q signal). The orthogonal modulator 20 is configured as a digital orthogonal modulator that subjects the IQ baseband signal to orthogonal modulation based on digital signal processing. The processor 22 subjects the orthogonally modulated signal outputted from the orthogonal modulator 20 to digital signal processing, and outputs a digital RF signal. The digital signal processing performed by the processor 22 includes, for example, digital pre-distortion (DPD), crest factor reduction (CFR), and digital up conversion (DUC).

The digital RF signal outputted from the processor 22 has a center frequency $f_0$, and a predetermined frequency band. The digital RF signal outputted from the processor 22 is provided to the delta-sigma modulator 24. The delta-sigma modulator 24 subjects the digital RF signal to delta-sigma modulation to quantize the digital RF signal, and outputs quantized data (pulse train). The pulse train outputted from the delta-sigma modulator 24 represents an analog RF signal. The transmitter 10 transmits the pulse train as a transmission signal.

[2.2 Delta-Sigma Modulation]

Figure 2A:
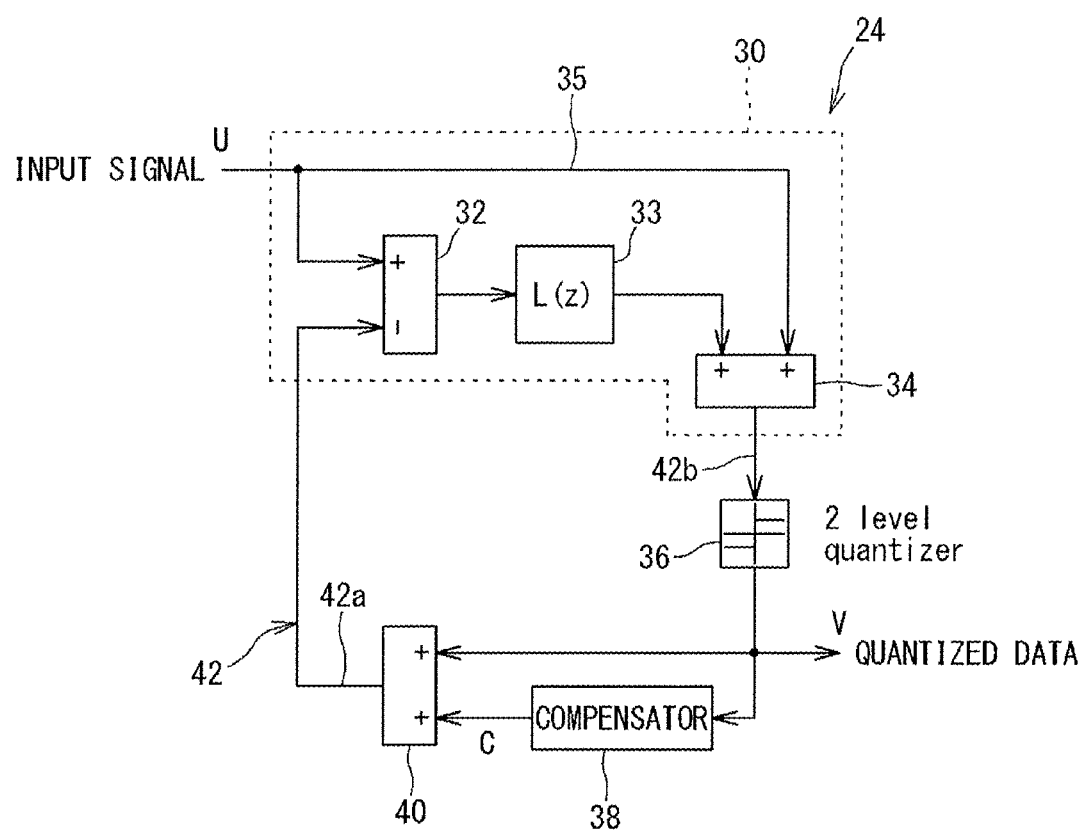
FIG. 2A is a block diagram showing a delta-sigma modulator.

When the delta-sigma modulator 24 is of a bandpass type, the delta-sigma modulator 24 performs noise shaping so that a signal component at a desired frequency (target frequency $f_0$) is allowed to pass therethrough, and noise in a band near the target frequency $f_0$ is caused to shift to the outside of the band. As shown in FIG. 2A, the delta-sigma modulator 24 includes a loop filter 30, a quantizer 36 that outputs quantized data, an internal path 42 connected to the loop filter 30 or the quantizer 36, a compensator 38, and an adder 40. The internal path 42 includes: a first path (feedback path) 42a for feeding the quantized data outputted from the quantizer 36 back to the loop filter 30; and a second path 42b for providing the output from the loop filter 30 to the quantizer 36. Since a path through which a signal flows only to the outside of the delta-sigma modulator 24 is substantially the same as an external path of the delta-sigma modulator 24, such a path is not included in the internal path 42. The internal path 42 is a path through which a signal can reach the quantizer 36 that generates an output from the delta-sigma modulator 24.

The loop filter 30 has two inputs and one output. An input signal (digital RF signal) to the delta-sigma modulator 24 and a feedback signal from the quantizer 36 side are inputted to the loop filter 30. The loop filter 30 includes a first adder 32, a transfer function block 33 for a transfer function L(z), a second adder 34, and a feed forward path 35.

The first adder 32 adds the input signal to the delta-sigma modulator 24 and the feedback signal from the quantizer 36 side. The feedback signal is provided to the first adder 32 via the first path 42a. The transfer function L(z) of the transfer function block 33 is used for determining characteristics of the delta-sigma modulator 24, and the transfer function L(z) is determined on the basis of a desired signal transfer function and a desired noise transfer function. The second adder 34 adds the output from the transfer function block 33 and the input signal to the delta-sigma modulator 24. The input signal is provided to the second adder 34 via the feed forward path 35. The feed forward path 35 and the second adder 34 may be dispensed with.

The output from the second adder 34, that is, the output from the loop filter 30, is provided to the quantizer 36 via the second path 42b. The quantizer 36 is a 1-bit quantizer, and outputs 1-bit quantized data obtained by quantizing the output from the loop filter 30 to 1 bit. The quantized data (pulse train) outputted from the quantizer 36 is outputted from the delta-sigma modulator 24 as an output from the delta-sigma modulator 24, and is fed back to the loop filter 30 via the first path 42a.

The compensator 38 outputs a compensation signal C for compensating for distortion that occurs in an analog RF signal having the target frequency $f_0$ (frequency component at the target frequency $f_0$) which is represented by the pulse train outputted from the delta-sigma modulator 24. The compensation signal C is used for canceling or suppressing the distortion that occurs in the RF signal. The compensation signal C outputted from the compensator 38 is provided to the first path 42a through the adder 40 disposed in the first path 42a. When the compensation signal C for canceling or suppressing the distortion is provided to the internal path 42 of the delta-sigma modulator 24, distortion compensation is performed inside the delta-sigma modulator 24. As a result, the quantized data outputted from the delta-sigma modulator 24 represents a distortion-compensated RF signal (frequency component at the target frequency $f_0$).

Since the delta-sigma modulator 24 includes the first path 42a which is a feedback path, the compensation signal necessarily passes through the transfer function block 33 regardless of where, in the internal path 42, the compensation signal is provided. Therefore, delta-sigma modulation of desired characteristics can be performed in the state where distortion compensation by the compensation signal has been performed. However, if the compensation signal is provided to the first path 42a as shown in FIG. 2A, the compensation signal passes through the transfer function block 33 before passing through the quantizer 36, whereby the operation is easily stabilized.

Figure 2B:
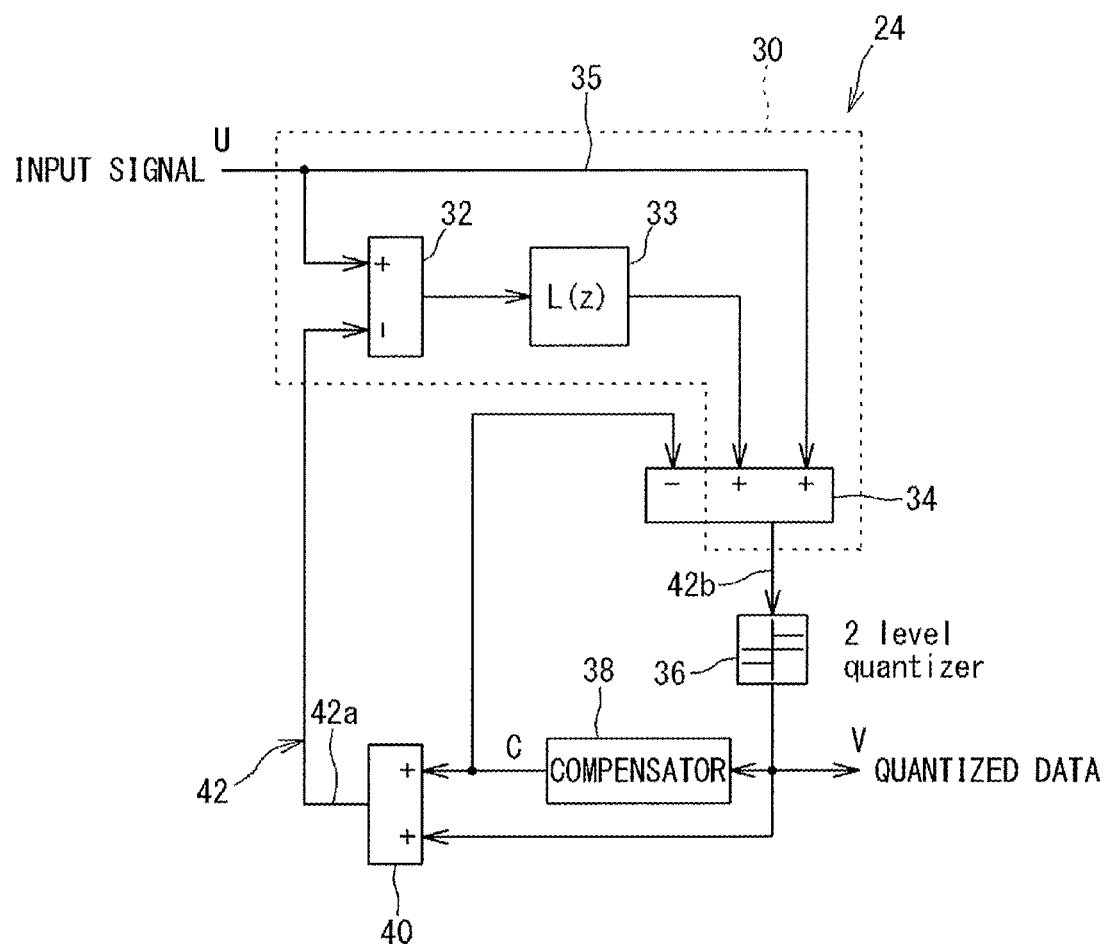
FIG. 2B is a block diagram showing another example of a delta-sigma modulator.

While the compensation signal is provided to the first path 42a in FIG. 2A, the compensation signal may be provided to another internal path 42 (e.g., the second path 42b). That is, as shown in FIG. 2B, the compensation signal C outputted from the compensator 38 may be provided not only to the first path 42a but also to the second path 42b through the second adder (adder/subtractor) 34 disposed in the second path 42b. The compensation signal C is provided to the second path 42b so that the compensation signal C is subtracted from the signal that flows in the second path 42b.

In the case where the compensation signal C is provided to the first path 42a and the second path 42b, distortion compensation can be performed over a wide frequency band. That is, in the case of the delta-sigma modulator 24 shown in FIG. 2A, an output V from the delta-sigma modulator 24 is expressed by the following equation (1):

[Math. 1]

$$V = U + NTF \times E - \frac{L(Z)}{1+L(Z)} \times C \tag{1}$$

Figure 2C:
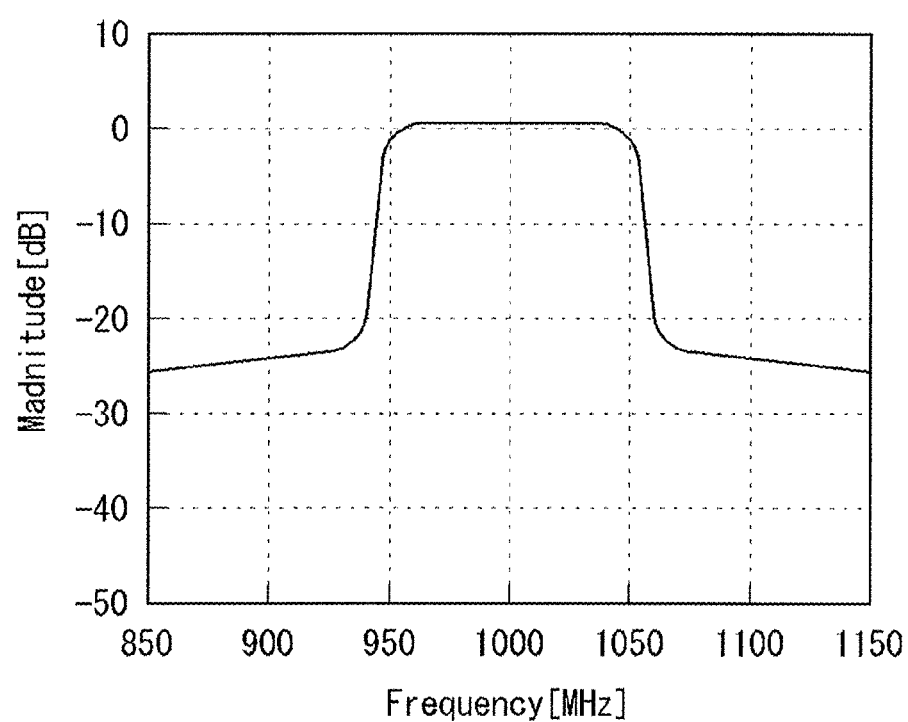
FIG. 2C is a diagram showing frequency characteristics of $L(z)/(1+L(z))$.

In the right side of equation (1), the first term is an input signal U, and the second term indicates a quantization noise E multiplied by filter characteristics based on a noise transfer function NTF of the delta-sigma modulator 24. If the right side of equation (1) consists of only the first and second terms, an output V from an ordinary delta-sigma modulator is obtained. However, in the delta-sigma modulator 24 shown in FIG. 2A, since the compensation signal C is provided to the first path 42a, the third term is generated in the right side of equation (1). In equation (1), the compensation signal C multiplied by filter characteristics of L(z)/(1+L(z)) is reflected in the output V. As shown in FIG. 2C, frequency characteristics of L(z)/(1+L(z)) represent "bandpass". That is, as shown in FIG. 2C, filter characteristics of L(z)/(1+L(z)) represent a "bandpass filter" having a pass band ranging from 950 MHz to 1050 MHz. Therefore, only a component, of the compensation signal C, in the pass band of the bandpass filter is reflected in the output V, resulting in distortion compensation in a relatively narrow band.

Meanwhile, in the case where the compensation signal C is also provided to the second path 42b as shown in FIG. 2B, the coefficient of C in equation (1) is 1, and the output from the delta-sigma modulator 24 is expressed by the following equation (2):

[Math. 2]

$$V = U + NTF \times E - C \tag{2}$$

Regarding the third term in the right side of equation (2), all frequency components of the compensation signal C are subtracted from the output V, and therefore, distortion compensation in a wide band is realized.

[2.3 Distortion of RF Signal Due to Waveform Distortion of Pulse Train, and Compensation Therefor]

In the present embodiment, as an example of distortion to be compensated for by the compensation signal outputted from the compensator 38, distortion that occurs in an RF signal due to waveform distortion of a pulse train outputted from the delta-sigma modulator 24 is assumed. Since the delta-sigma modulator 24 outputs quantized data as a pulse train, if the waveform of the pulse train is distorted, distortion occurs in the RF signal represented by the pulse train. Specifically, as described in Patent Literature 1, distortion occurs in the RF signal (frequency component at the target frequency $f_0$) due to asymmetry in rising and falling of a pulse in the pulse train corresponding to the quantized data.

The delta-sigma modulator 24 includes a driver (not shown) for outputting the pulse train corresponding to the quantized data. This driver includes a switching element and the like, and rising and falling of a pulse are generated by ON/OFF operation of the switching element. Generally, rising time and falling time of a pulse generated by the driver do not coincide with each other, whereby asymmetry in rising and falling of the pulse occurs. The asymmetric components degrade the RF signal. The asymmetric components at rising and falling of the pulse are defined as follows.

First, a pulse train $S_{out}(t)$ outputted from the delta-sigma modulator 24 is defined by the following equation (A):

[Math. 3]

$$S_{out}(t)=S_{Ideal}(t)+\Sigma_k f(t-kT)\{U(t-kT)-U(t-T-kT)\} \quad (A)$$

In equation (A), $S_{Ideal}$, which is the first term, represents quantized data $d_k$ (=±1) by an ideal square wave, and is defined by the following equation (B). In equation (B), the quantized data $d_k$ takes +1 as a value corresponding to "High" level of the pulse, and takes −1 as a value corresponding to "Low" level of the pulse. $U(t)$ is a unit step function.

[Math. 4]

$$S_{Ideal}(t)=\Sigma_k d_k\{U(t-kT)-U(t-T-kT)\} \quad (B)$$

The second term in equation (A) expresses the difference between $S_{out}(t)$ corresponding to the actual waveform and the ideal waveform $S_{Ideal}(t)$. In addition, $f(t-kt)$ in the second term is defined by the following equation (C). In equation (C), Sign is a sign function.

[Math. 5]

$$f(t-kT) = \begin{cases} f_{rise}(t-kT) & \ldots \text{Sign}(d_k - d_{k-1}) = 1 \quad (C\text{-}1) \\ f_{fall}(t-kT) & \ldots \text{Sign}(d_k - d_{k-1}) = -1 \quad (C\text{-}2) \\ 0 & \ldots \text{Sign}(d_k - d_{k-1}) = 0 \quad (C\text{-}3) \end{cases} \quad (C)$$

[Math. 6]

$$\begin{cases} f_{rise}(t) = f_{Asym}(t) + f_{Sym}(t) & (D\text{-}1) \\ f_{fall}(t) = f_{Asym}(t) - f_{Sym}(t) & (D\text{-}2) \end{cases} \quad (D)$$

In equation (C), (C-1) expresses a case where the sign of a value indicating the difference between a value $d_k$ of certain quantized data and a value $d_{k-1}$ of quantized data that is temporally previous to the certain quantized data is plus, that is, a case where a pulse corresponding to the quantized data $d_k$ rises.

(C-2) expresses a case where the sign of the value indicating the difference between the value $d_k$ of the certain quantized data and the value $d_{k-1}$ of the quantized data that is temporally previous to the certain quantized data is minus, that is, a case where a pulse corresponding to the quantized signal $d_k$ falls.

(C-3) expresses a case where the value indicating the difference between the value $d_k$ of the certain quantized data and the value $d_{k-1}$ of the quantized data that is temporally previous to the certain quantized data is zero, that is, a case where the value of the pulse does not change.

In equation (D), $f_{rise}(t)$ and $f_{fall}(t)$ indicate a rising waveform and a falling waveform of the pulse, respectively. As shown in equation (D), $f_{rise}(t)$ and $f_{fall}(t)$ each can be decomposed to a symmetric component $f_{sym}(t)$ and an asymmetric component $f_{Asym}(t)$.

The asymmetric component $f_{Asym}(t)$ can be obtained from equation (D) according to the following formula (E):

[Math. 7]

$$f_{Asym}(t) = \frac{f_{rise}(t) + f_{fall}(t)}{2} \quad (E)$$

Equation (E) indicates that the asymmetric component $f_{Asym}(t)$ is removed when the rising waveform $f_{rise}(t)$ and the falling waveform $f_{fall}(t)$ satisfy the relationship expressed by the following equation (F):

[Math. 8]

$$f_{rise}(t)=-f_{fall}(t) \quad (F)$$

Figure 3A:
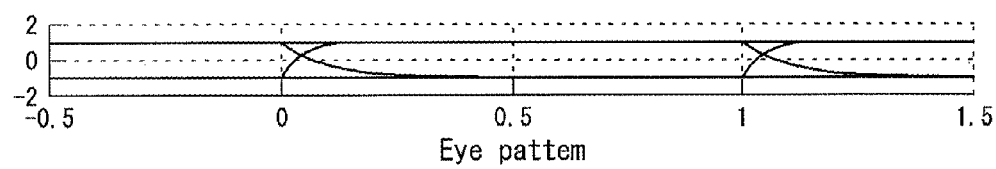
FIG. 3A shows an eye pattern of the asymmetric waveform $S_{out}(t)$.

FIG. 3A shows a pulse waveform (an asymmetric waveform having asymmetric components) that does not satisfy equation (F). FIG. 3A shows an eye pattern of the asymmetric waveform $S_{out}(t)$. This eye pattern is asymmetric with respect to the time axis. Specifically, in the asymmetric waveform shown in FIG. 3A, the pulse falling time is longer than the pulse rising time.

Figure 3B:
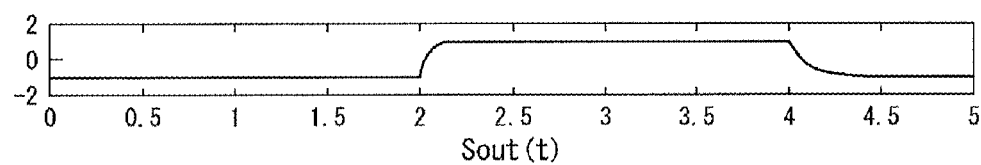
FIG. 3B shows a time axis waveform of an asymmetric waveform $S_{out}(t)$.
Figure 3C:
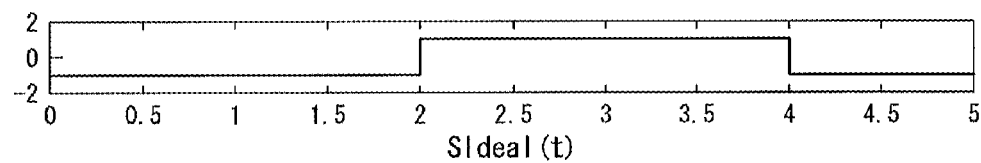
FIG. 3C shows an ideal waveform $S_{Ideal}(t)$ for the asymmetric waveform.
Figure 3D:
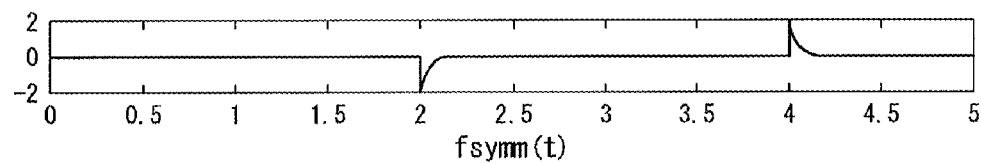
FIG. 3D shows symmetric components $f_{sym}(t)$ in a rising waveform $f_{rise}(t)$ and a falling waveform $f_{fall}(t)$ in the asymmetric waveform.
Figure 3E:
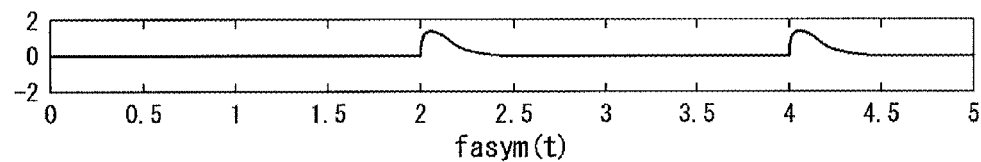
FIG. 3E shows asymmetric metric components $f_{Asym}(t)$ in the rising waveform $f_{rise}(t)$ and the falling waveform $f_{fall}(t)$ in the asymmetric waveform.

FIG. 3B shows a time axis waveform of the asymmetric waveform $S_{out}(t)$, FIG. 3C shows an ideal waveform $S_{Ideal}(t)$ for the asymmetric waveform, FIG. 3D shows symmetric components $f_{sym}(t)$ in the rising waveform $f_{rise}(t)$ and the falling waveform $f_{fall}(t)$ in the asymmetric waveform, and FIG. 3E shows asymmetric components $f_{Asym}(t)$ in the rising waveform $f_{rise}(t)$ and the falling waveform $f_{fall}(t)$ in the asymmetric waveform.

As shown in FIG. 3E, the asymmetric waveform is distorted with respect to the ideal waveform $S_{Ideal}(t)$, and has distortion components. Specifically, the asymmetric waveform has a distortion component (first distortion component) in the pulse rising waveform $f_{rise}(t)$, and has a distortion component (second distortion component) in the pulse falling waveform $f_{fall}(t)$.

When equation (F) is not satisfied, the distortion component has the symmetric components $f_{sym}(t)$ and the asymmetric components $f_{Asym}(t)$ (refer to FIG. 3D and FIG. 3E). Of the distortion components, presence of the symmetric components $f_{sym}(t)$ is less likely to affect the characteristics (e.g., adjacent channel leakage ratio (ACLR)) of the RF signal, but the asymmetric components $f_{Asym}(t)$ affect the characteristics of the RF signal (refer to Patent Literature 1). That is, the shape of the pulse outputted from the delta-sigma modulator 24 affects the RF signal (frequency component at the target frequency $f_0$) to be processed by the delta-sigma modulator 24.

In the present embodiment, distortion of the RF signal, which will occur due to waveform distortion (asymmetric components) of the pulse train, is compensated for in advance by the compensation signal in the delta-sigma modulator 24, before the pulse train is outputted. Therefore, even if the pulse waveform outputted from the delta-sigma modulator 24 has the asymmetric components, degradation of the ACLR of the RF signal is suppressed.

Figure 4:
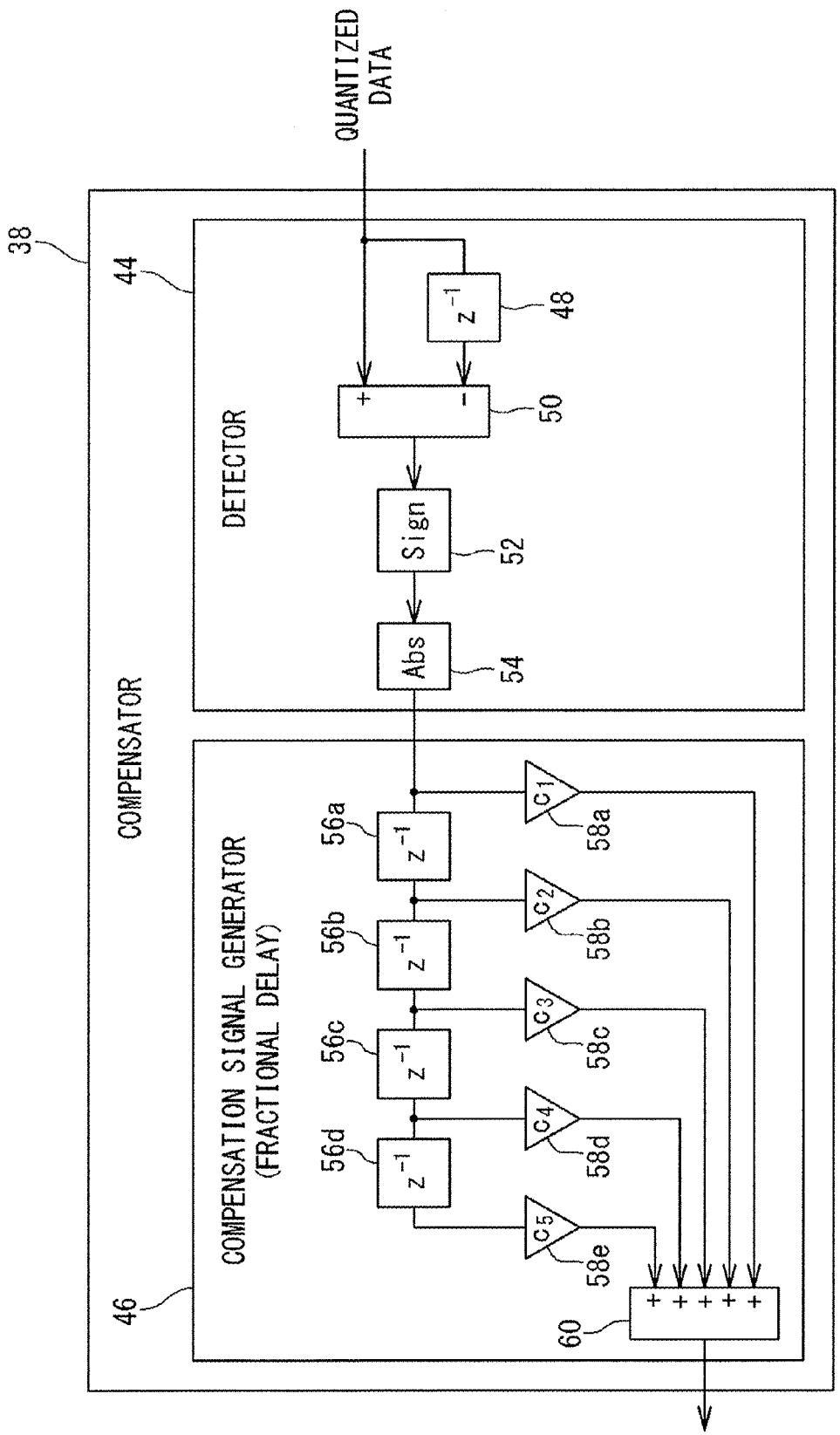
FIG. 4 is a block diagram showing a compensator.

FIG. 4 shows an example of the compensator 38 suitable for compensating for distortion that may occur due to the asymmetric components at rising and falling of the pulse train. The compensator 38 includes a detector 44 and a compensation signal generator 46.

The detector 44 detects a change in the quantized data (rising or falling of the pulse train). Since the asymmetric components occur at rising and falling of the pulse train, occurrence of the asymmetric components can be detected by detecting rising or falling of the pulse train. The quantized data (pulse train) outputted from the quantizer 36 is inputted to the detector 44. The detector 44 outputs a detection signal (pulse-like detection signal) at a timing when the quantized data changes.

Figure 5:
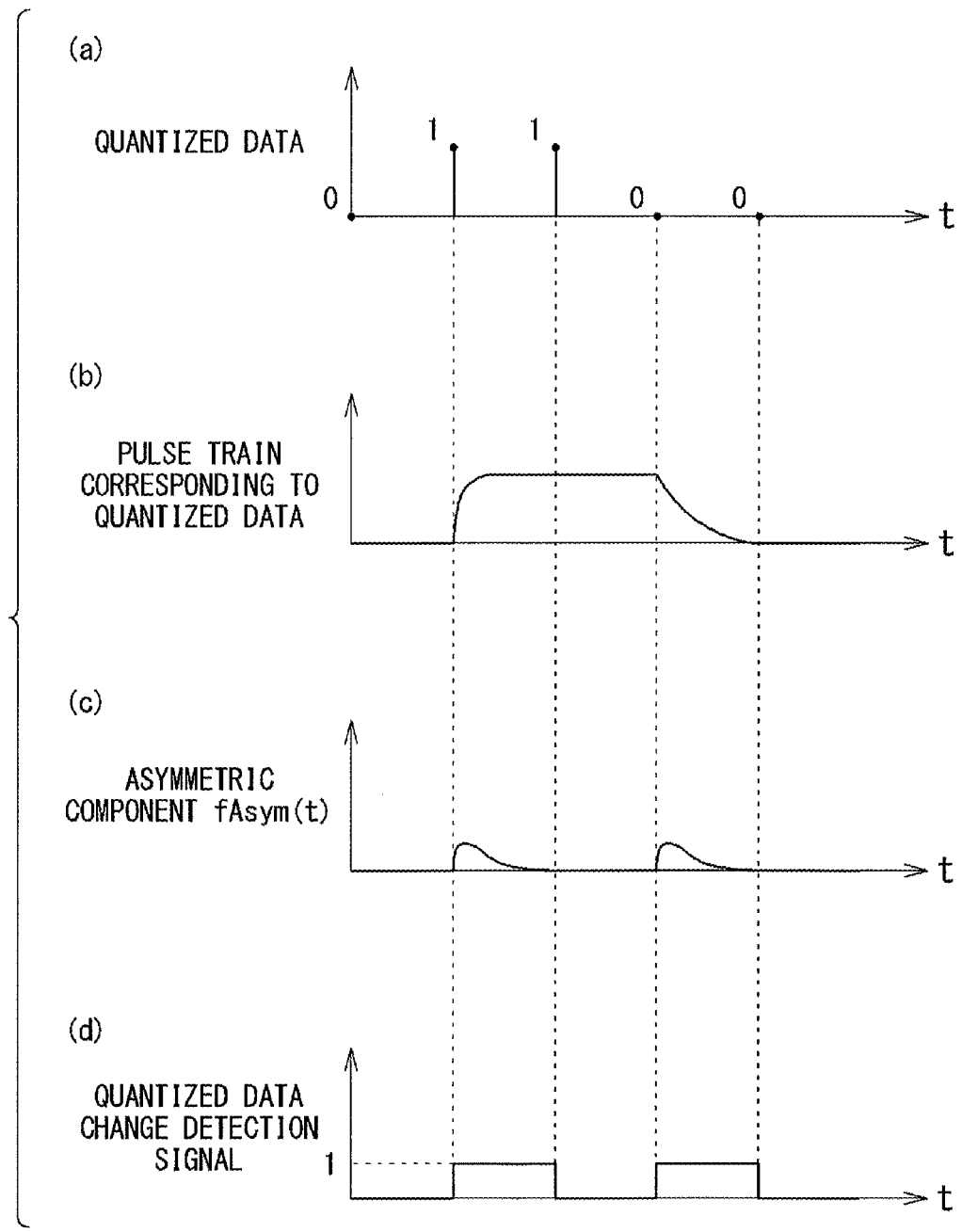
FIG. 5 is a waveform diagram showing an asymmetric waveform and a detection signal.

For example, in the case where the quantized data per sampling clock in the delta-sigma modulator 24 changes as shown in (a) of FIG. 5, the pulse train outputted from the delta-sigma modulator 24 is as shown in (b) of FIG. 5. As shown in (c) of FIG. 5, asymmetric components occur at rising and falling of the pulse train shown in (b) of FIG. 5. As shown in (d) of FIG. 5, the detector 44 outputs a detection signal (quantized data change detection signal) in accordance with the timing when an asymmetric component occurs.

Returning to FIG. 4, in order to generate the detection signal shown in (d) of FIG. 5, the detector 44 includes a delay element 48, an adder 50, a sign function section 52, and an Abs (absolute value) function section 54. The adder (differentiator) 50 of the detector 44 calculates the difference between the quantized data in a certain sampling clock and the quantized data in a clock previous to the certain sampling clock. The delay element 48 provides, to the adder 50, the quantized data in the clock previous to the certain sampling clock. The adder 50 outputs 0 when the quantized data in the certain sampling clock matches the quantized data in the clock previous to the certain sampling clock. The adder 50 outputs a value other than 0 when there is no match (when the quantized data has changed). The sign function section 52 outputs +1, −1, or 0 in accordance with the sign of the output from the adder 50. The Abs function section 54 outputs the absolute value of the output of the sign function section 52. That is, the Abs function section 54 outputs 1 when, in each sampling block, the quantized data has changed from the quantized data in the previous sampling clock, and outputs 0 when, in each sampling block, the quantized data has not changed. Therefore, the detector 44 can output the detection signal as shown in (d) of FIG. 5.

The compensation signal generator 46 generates a compensation signal for suppressing the asymmetric components (refer to (c) of FIG. 5) on the basis of the detection signal indicating a change in the quantized data. The compensation signal generator 46 is composed of a fractional delay. This fractional delay has the same structure as a finite impulse response (FIR) filter. That is, the compensation signal generator 46 has a multiple-tap FIR filter structure including a plurality of delay elements 56a, 56b, 56c, and 56d, a plurality of gain control elements 58a, 58b, 58c, 58d, and 58e, and an adder 60. The compensation signal generator 46 shown in FIG. 4 has a four-tap digital filter structure.

The compensation signal generator 46 functions as a filter for the pulse-like detection signal, and generates a compensation signal for suppressing the asymmetric components that cause distortion in the RF signal as the frequency component at the target frequency $f_0$. Since the pulse-like detection signal has a wide frequency component, it is easy for the compensation signal generator 46 to generate the compensation signal by use of the filter function. The detection signal is not limited to the pulse-like detection signal, and any detection signal may be adopted as long as it has a frequency component required for the compensation signal.

In order to generate an appropriate compensation signal from the detection signal, a coefficient (gain) Ci (i=1 to N; N is the number of the gain control elements; in FIG. 4, N=5) of each of the gain control elements 58a to 58e should be appropriately set. Since the asymmetric components vary depending on the delta-sigma modulator 24 (the driver that outputs the pulse train), coefficients Ci that enable generation of an appropriate compensation signal are determined and set in the respective gain control elements 58a to 58e in advance.

Figure 6:
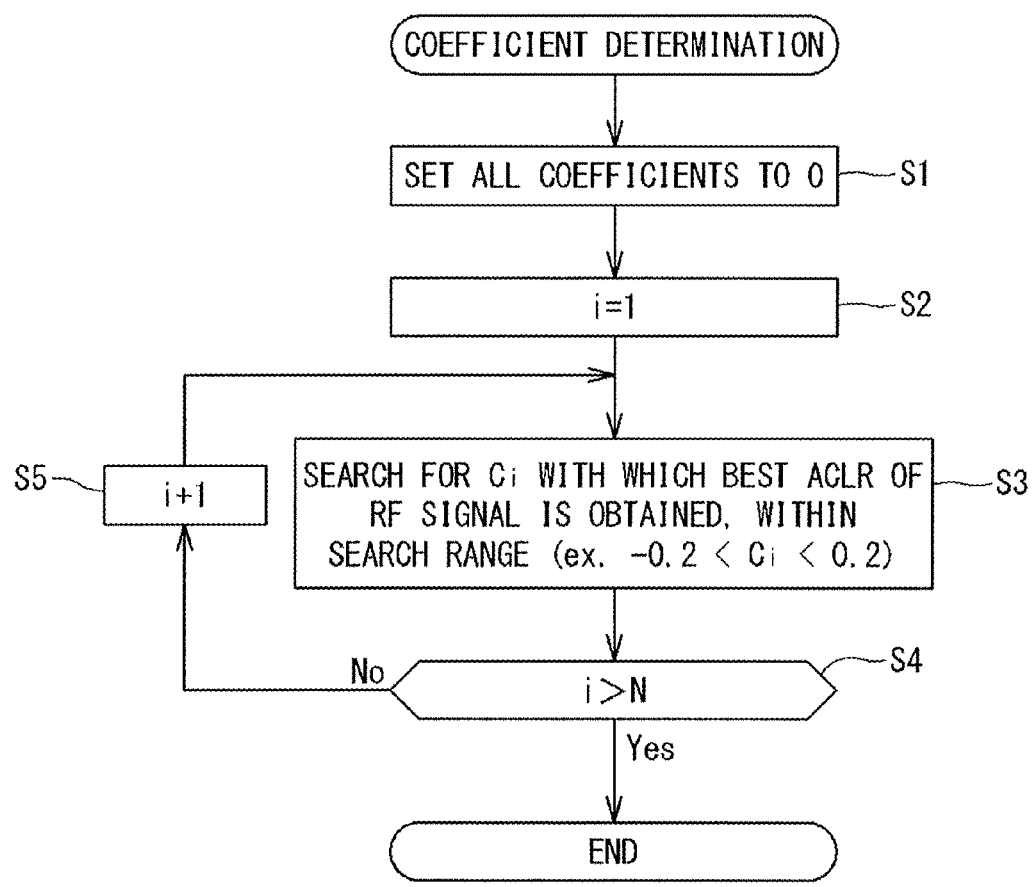
FIG. 6 is a flowchart of a coefficient determination process.

FIG. 6 shows a method of determining the coefficients (gains) Ci of the respective gain control elements 58a to 58e. First, a digital RF signal (a test signal for coefficient determination) is inputted to the delta-sigma modulator 24 to simulate a state where quantized data (pulse train) is outputted from the delta-sigma modulator 24. In this state, processing shown in FIG. 6 is performed. In step S1, the coefficients of all the gain control elements 58a to 58e are set to zero. When all the coefficients are set to zero, the compensation signal also becomes zero (no compensation signal). Then, coefficients C1 to C5 are determined in order (steps S2 to S5). Specifically, first, the coefficient C1 (i=1) is determined. In order to determine the coefficient C1, the ACLR of the output (RF signal) from the delta-sigma modulator 24 is measured while changing the value of the coefficient C1 within a predetermined search range (e.g., from −0.2 to 0.2). A value at which the best ACLR is obtained is determined as the value of the coefficient C1 (step S3).

Figure 7A:
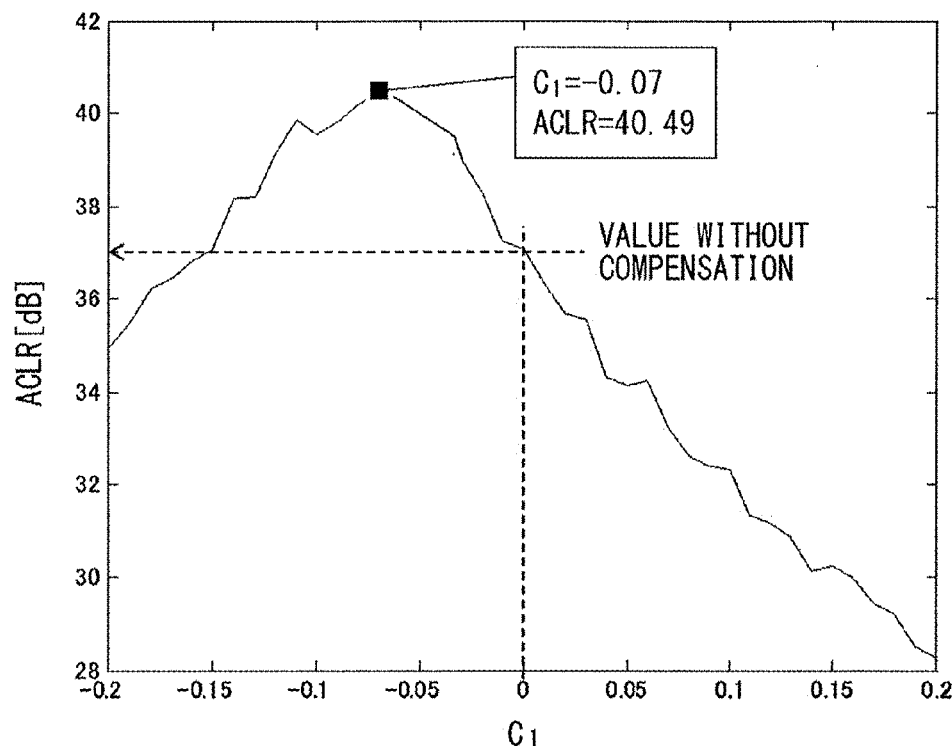
FIG. 7A is a diagram showing ACLR (vertical axis) in the case where the coefficient C1 (horizontal axis) is changed within the range from −0.2 to 0.2.

FIG. 7A shows the ACLR (vertical axis) in the case where the coefficient C1 (horizontal axis) is changed within the range from −0.2 to 0.2. FIG. 7A shows that the best ACLR, i.e., ACLR=40.49 [dB], is obtained at C1=−0.07. Accordingly, C1 is set to −0.07.

Figure 7B:
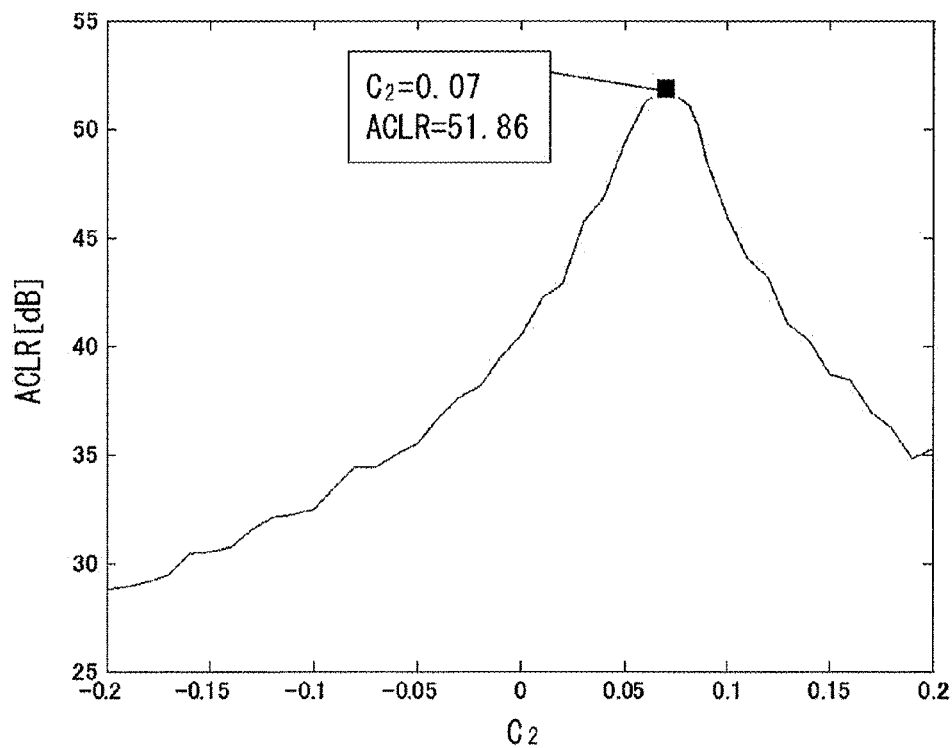
FIG. 7B is a diagram showing ACLR (vertical axis) in the case where the coefficient C2 (horizontal axis) is changed within the range from −0.2 to 0.2 in the state where C1=−0.07.

Next, in the state where C1=−0.07, the coefficient C2 is determined. In order to determine the coefficient C2 (I=2), the ALCR is measured while changing the coefficient C2 within the range from −0.2 to 0.2 in the state where C1=−0.07. FIG. 7B shows the ACLR (vertical axis) in the case where the coefficient C2 (horizontal axis) is changed within the range from −0.2 to 0.2 in the state where C1=−0.07. FIG. 7B shows that the best ACLR, i.e., ACLR=51.86 [dB], is obtained at C2=0.07. Accordingly, C2 is set to 0.07.

The coefficients C3, C4, and C5 are also determined in a similar manner, thereby determining all the coefficients C1 to C5.

Figure 8:
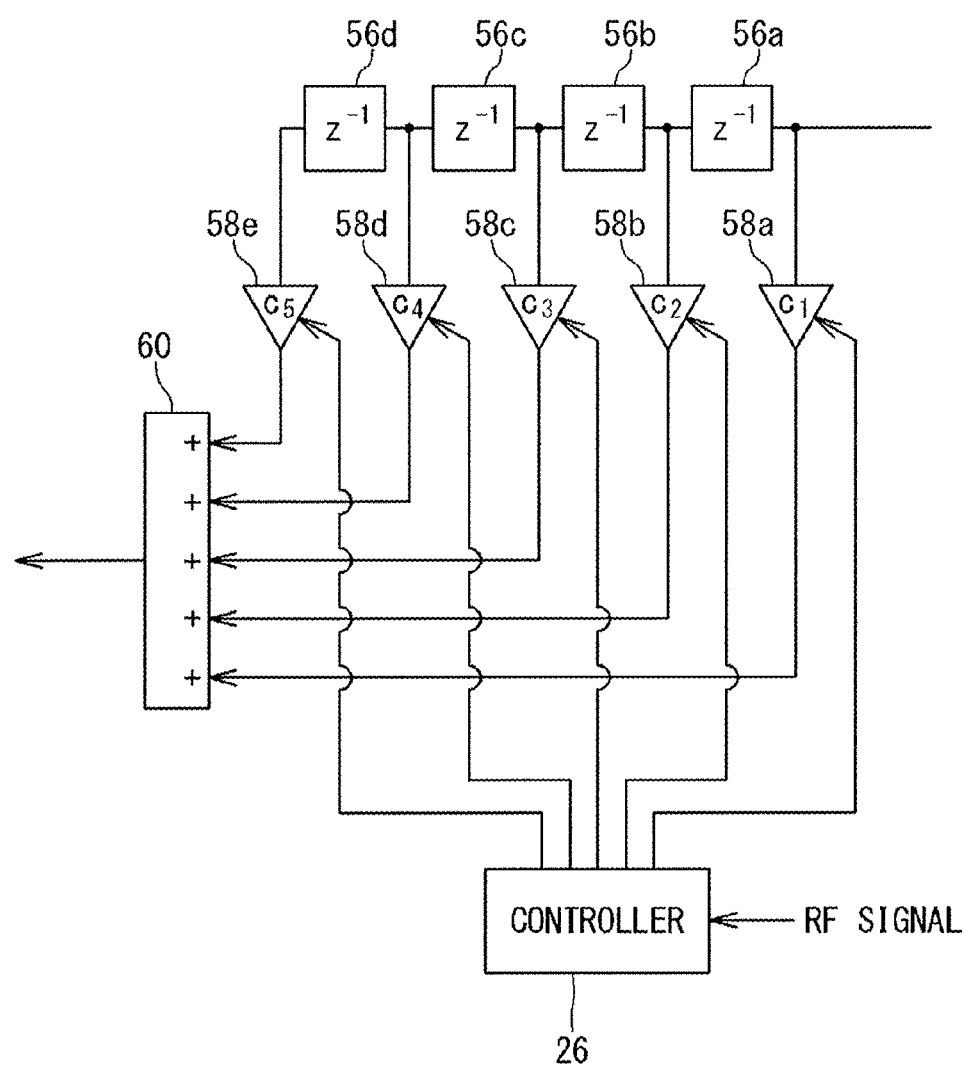
FIG. 8 is a block diagram showing another example of a compensation signal generation section.
Figure 9:
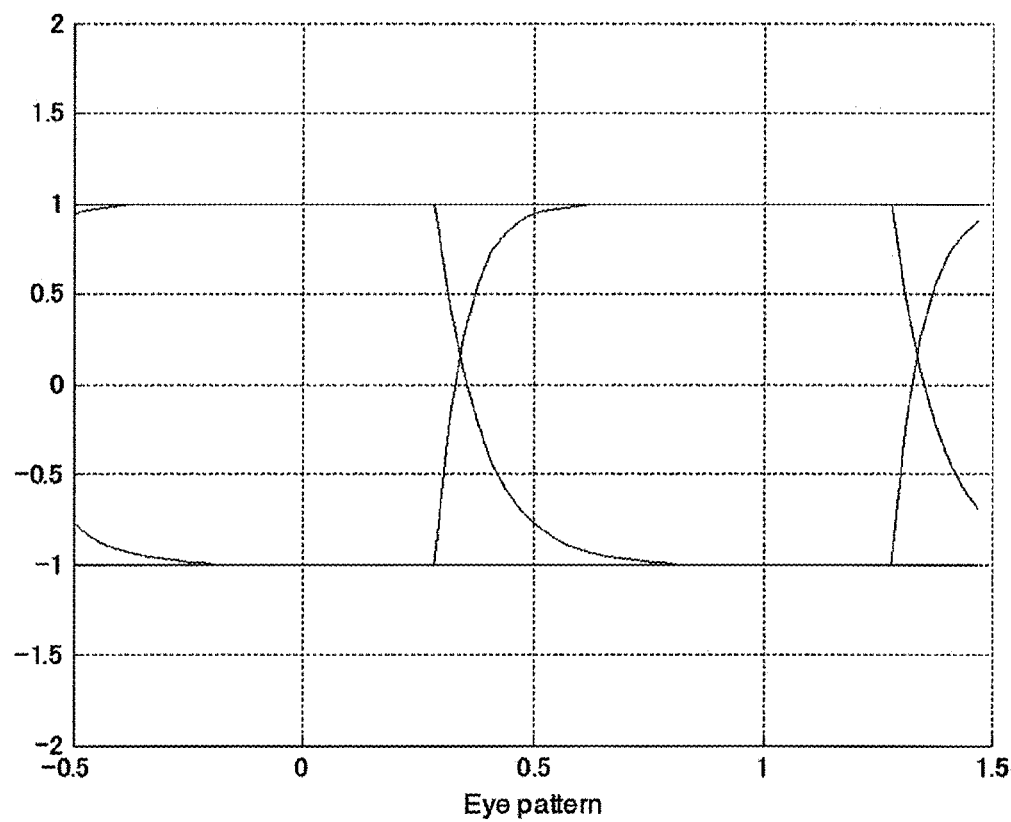
FIG. 9 shows an eye pattern of an RF signal.

The processing shown in FIG. 6 may be performed before shipment of the delta-sigma modulator 24 or equipment (transmitter 10, etc.) that outputs a pulse train corresponding to quantized data generated by the delta-sigma modulator 24, or may be performed when the processing is needed during the operation of the delta-sigma modulator 24 to dynamically change the coefficients C1 to C5. FIG. 8 shows a structure for dynamically changing the coefficients C1 to C5. The controller 26 is able to change the coefficients C1 to C5 of the gain control elements 58a to 58e. Further, the controller 26 is configured to acquire a pulse train (an RF signal represented by the pulse train) corresponding to quantized data outputted from the delta-sigma modulator 24. The controller 26 configured as described above can change the coefficients C1 to C5 by performing the processing shown in FIG. 6. In this case, if the asymmetric components in the pulse train change with time, distortion can be appropriately compensated for by updating the coefficients C1 to C5.

Figure 10B:
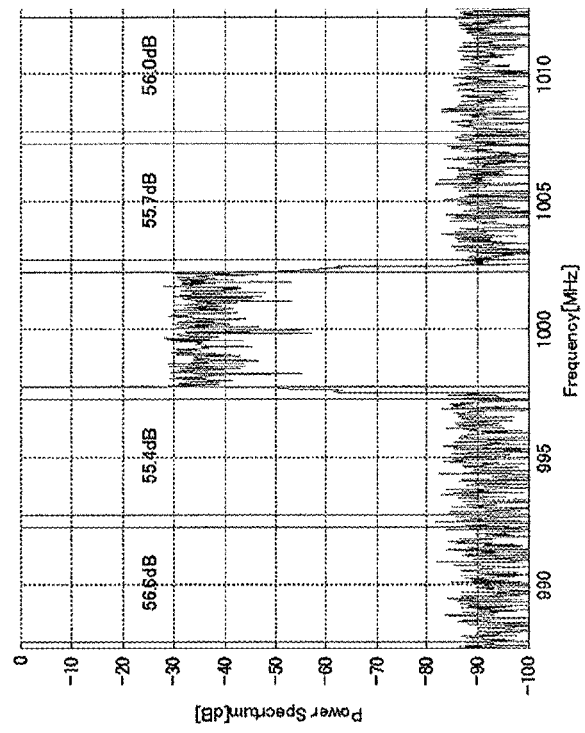
FIG. 10B shows a frequency spectrum of an RF signal and shows ACLR in the case where compensation by the compensator is performed.
Figure 10A:
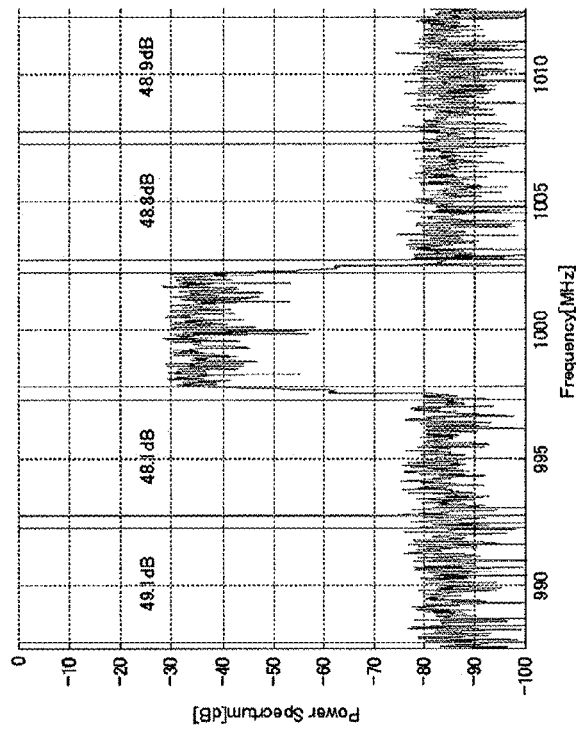
FIG. 10A shows a frequency spectrum of an RF signal and shows ACLR in the case where compensation by the compensator is not performed.

FIG. 9, FIG. 10A, FIG. 10B, FIG. 11A, and FIG. 11B indicate that distortion of the RF signal, which may occur due to the asymmetric components, is compensated for by the compensation signal, and the ACLR of the RF signal is improved. As shown in an eye pattern of FIG. 9, the output from the delta-sigma modulator 24 contains asymmetric components because the pulse rising time and the pulse falling time are different from each other. FIG. 10A, FIG.

Figure 11A:
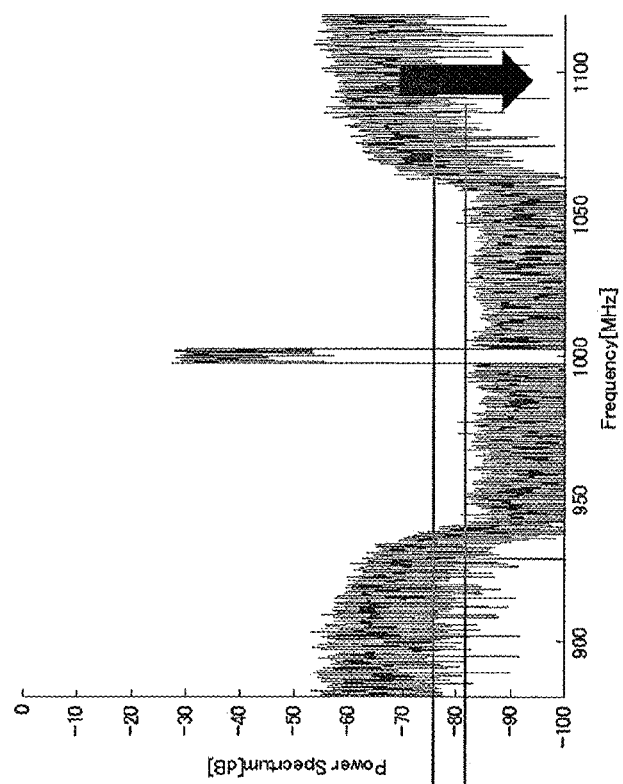
FIG. 11A shows a frequency spectrum having a wider band than the frequency spectrum shown in FIG. 10A and shows ACLR in the case where compensation by the compensator is not performed.
Figure 11B:
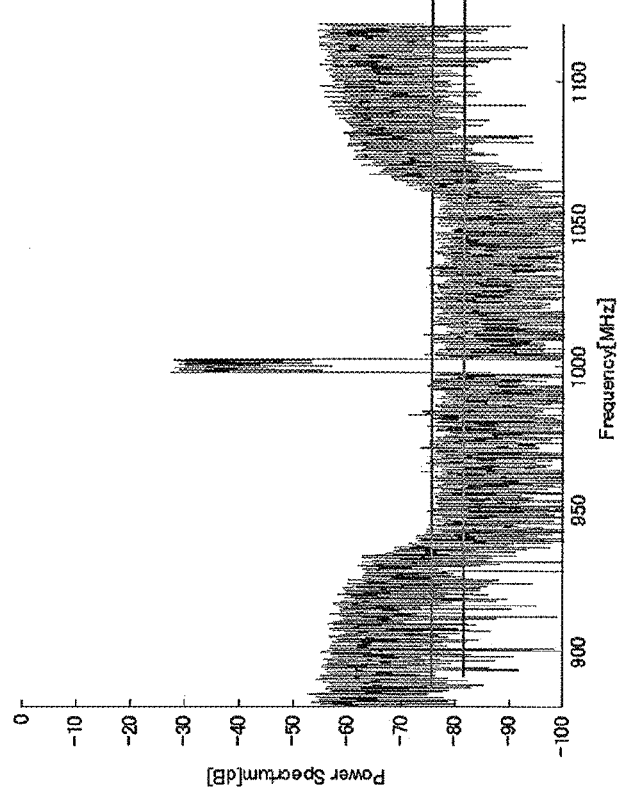
FIG. 11B shows a frequency spectrum having a wider band than the frequency spectrum shown in FIG. 10B and shows ACLR in the case where compensation by the compensator is performed.

10B, FIG. 11A, and FIG. 11B show the ACLR of the RF signal represented by the pulse train (FIG. 9) outputted from the delta-sigma modulator 24. The RF signal has a center frequency (target frequency) of 1000 MHz. FIGS. 10A and 11A each show the ACLR in the case where compensation by the compensator 38 is not performed. On the other hand, FIGS. 10B and 11B each show the ACLR in the case where compensation by the compensator 38 is performed. The ACLR is lower in FIGS. 10B and 11B than in FIGS. 10A and 11A. Therefore, the effect of compensation by the compensator 38 is observed.

The compensator 38 is not limited to that shown in FIG. 4. Any compensator may be adopted as long as the compensator outputs a compensation signal for compensating for distortion of an RF signal represented by a pulse train.

In addition, the compensator 38 is not limited to a compensator which compensates for distortion that occurs in the target frequency $f_0$ due to asymmetric components that occur in a pulse train (a pulse train corresponding to quantized data) directly outputted from the delta-sigma modulator 24. The compensator 38 may be a compensator which compensates for distortion that occurs in the target frequency $f_0$ due to asymmetric components that occur in a pulse train (a pulse train corresponding to quantized data) outputted from another equipment. For example, when a receiver, which has received a pulse train (e.g., a pulse train of an optical signal) outputted from a transmitter including the delta-sigma modulator 24, outputs a pulse train of an electric signal corresponding to the optical signal, the delta-sigma modulator 24 included in the transmitter may perform compensation for distortion that occurs due to asymmetric components in the pulse train outputted from the receiver.

[2.4 Distortion Compensation in Dual-Band Delta-Sigma Modulator]

Figure 12:
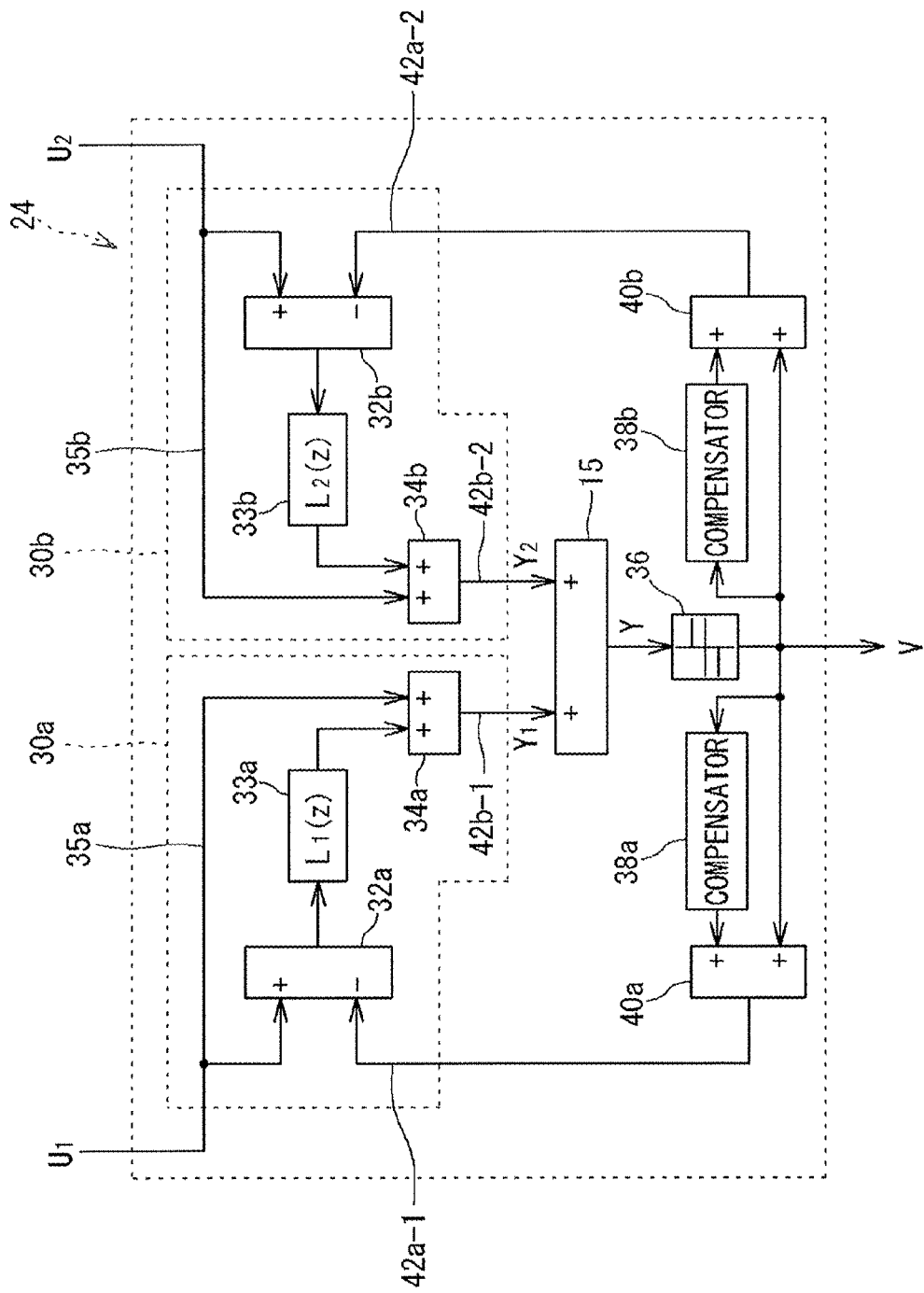
FIG. 12 is a block diagram showing a dual-band delta-sigma modulator.

FIG. 12 shows a dual-band delta-sigma modulator (multi-band delta-sigma modulator) 24. The dual-band delta-sigma modulator (multi-band delta-sigma modulator) 24 is disclosed in Japanese Laid-Open Patent Publication No. 2014-165846. The dual-band delta-sigma modulator 24 is able to receive two (multiple) input signals $U_1$ and $U_2$ having different frequencies, and includes a plurality of loop filters (a first loop filter 30a and a second loop filter 30b), an adder 15 that adds the outputs from the filters 30a and 30b, and a quantizer 36 that quantizes the output from the adder 15. The quantizer 36 of the delta-sigma modulator 24 outputs a single output signal (quantized data) including the two input signals $U_1$ and $U_2$.

The delta-sigma modulator 24 includes, as internal paths, a first path 42a-1 for feeding the quantized data outputted from the quantizer 36 back to the first loop filter 30a, and a first path 42a-2 for feeding the quantized data outputted from the quantizer 36 back to the second loop filter 30b.

The delta-sigma modulator 24 further includes, as internal paths, a second path 42b-1 extending from the first loop filter 30a to the adder 15 in order to provide the output from the first loop filter 30a to the quantizer 36, and a second path 42b-2 extending from the second loop filter 30b to the adder 15 in order to provide the output from the second loop filter 30b to the quantizer 36.

The first loop filter 30a, like the loop filter 30 shown in FIG. 2A, includes a first adder 32a, a transfer function block 33a for $L_1(z)$, a second adder 34a, and a feed forward path 35a. The second loop filter 30b, like the loop filter 30 shown in FIG. 2A, includes a first adder 32b, a transfer function block 33b for $L_2(z)$, a second adder 34b, and a feed forward path 35b.

The first input signal $U_1$ inputted to the first loop filter 30a is, for example, a first RF signal having a center frequency $f_1$ (first target frequency $f_1$). The second input signal $U_2$ inputted to the second loop filter 30b is a second RF signal having a center frequency $f_2$ (second target frequency $f_2$).

In the case of the delta-sigma modulator 24 to which the two (multiple) input signals $U_1$ and $U_2$ having different frequencies are inputted, a plurality of (two) compensators 38a and 38b corresponding to the number of the input signals $U_1$ and $U_2$ are provided. The plurality of compensators 38a and 38b include the first compensator 38a and the second compensator 38b. The first compensator 38a outputs a first compensation signal. The first compensation signal is provided for compensating for distortion that occurs in the first RF signal having the frequency $f_1$ (frequency component at the first target frequency $f_1$) represented by the pulse train outputted from the delta-sigma modulator 24. The first compensation signal is provided to the first path 42a-1 for feeding the quantized data outputted from the quantizer 36 back to the first loop filter 30a. The first compensation signal is provided to the first path 42a-1 through the adder 40a disposed in the first path 42a-1.

The second compensator 38b outputs a second compensation signal. The second compensation signal is provided for compensating for distortion that occurs in the second RF signal having the frequency $f_2$ (frequency component at the second target frequency $f_2$) expressed by the pulse train outputted from the delta-sigma modulator 24. The second compensation signal is provided to the first path 42a-2 for feeding the quantized data outputted from the quantizer 36 back to the second loop filter 30b. The second compensation signal is provided to the first path 42a-2 through the adder 40b disposed in the first path 42a-2. The first compensation signal may be provided to the second path 42b-1, for example. The second compensation signal may be provided to the second path 42b-2, for example.

According to the delta-sigma modulator 24 shown in FIG. 12, even if the pulse waveform outputted from the delta-sigma modulator 24 has asymmetric components, degradation of the ACLR of the first RF signal and the second RF signal is suppressed.

3. Additional Notes

Note that the embodiment disclosed herein is merely illustrative in all aspects and should not be recognized as being restrictive. The scope of the present invention is defined by the scope of the claims rather than by the meaning described above, and is intended to include meaning equivalent to the scope of the claims and all modifications within the scope.

REFERENCE SIGNS LIST 10 transmitter
12 digital signal processor
14 signal transmission path
15 adder
16 analog filter (analog BPF)
18 baseband section
20 digital orthogonal modulator
22 processor
24 delta-sigma modulator
26 controller
30 loop filter
30a first loop filter
30b second loop filter 32 first adder
32a first adder
32b first adder
33 transfer function block
33a transfer function block
33b transfer function block
34 second adder
34a second adder
34b second adder
35 feed forward path
35a feed forward path
35b feed forward path
36 quantizer
38 compensator
38a first compensator
38b second compensator
40 adder
40a adder
40b adder
42 internal path
42a first path
42b second path
42a-1 first path
42b-1 second path
42a-2 first path
42b-2 second path
44 detector
46 compensation signal generator
48 delay element
50 adder
52 sign function section
54 Abs function section
56a, 56b, 56c, 56d delay element
58a, 58b, 58c, 58d, 58e gain control element
60 adder

The invention claimed is:

1. A delta-sigma modulator comprising:
a loop filter to which a RF signal is provided;
a quantizer configured to generate quantized data on the basis of an output from the loop filter;
an internal path connected to the loop filter or the quantizer; and
a compensator configured to provide, to the internal path, a compensation signal for compensating for distortion that occurs in a frequency component at a target frequency, the frequency component being among frequency components of a pulse train corresponding to the quantized data, the target frequency being a frequency of the RF signal.

2. The delta-sigma modulator according to claim 1, wherein the distortion includes distortion that occurs in the frequency component having the target frequency due to asymmetry in rising and falling of a pulse in the pulse train corresponding to the quantized data.

3. The delta-sigma modulator according to claim 2, wherein the compensator includes:

a detector configured to detect a change in the quantized data; and
a generator configured to generate the compensation signal on the basis of the change in the quantized data which is detected by the detector.

4. The delta-sigma modulator according to claim 3, wherein the detector outputs a detection signal at a timing when the quantized data changes.

5. The delta-sigma modulator according to claim 4, wherein
the generator includes a fractional delay, and
the fractional delay generates the compensation signal on the basis of the detection signal.

6. The delta-sigma modulator according to claim 1, wherein the quantizer is a 1-bit quantizer.

7. The delta-sigma modulator according to claim 1, wherein
the internal path includes a first path for feeding the quantized data back to the loop filter, and
the compensator provides the compensation signal to the first path.

8. The delta-sigma modulator according to claim 1, wherein
the internal path includes a second path for providing an output from the loop filter to the quantizer, and
the compensator provides the compensation signal to the second path.

9. The delta-sigma modulator according to claim 7, wherein
the internal path includes a second path for providing an output from the loop filter to the quantizer, and
the compensator further provides the compensation signal to the second path.

10. A transmitter including the delta-sigma modulator according to claim 1,
the transmitter being configured to output, as a transmission signal, a pulse corresponding to the quantized data.

11. A delta-sigma modulator comprising:
a loop filter to which a RF signal is provided;
a control unit configured to control the loop filter to cause the loop filter correspond to the frequency of the RF signal;
a quantizer configured to generate quantized data on the basis of an output from the loop filter;
an internal path connected to the loop filter or the quantizer; and
a compensator configured to provide, to the internal path, a compensation signal for compensating for distortion that occurs in a frequency component at a target frequency, the frequency component being among frequency components of a pulse train corresponding to the quantized data, the target frequency being a frequency of the RF signal.

* * * * *